United States Patent
Dobyns et al.

(10) Patent No.: US 7,855,547 B2
(45) Date of Patent: Dec. 21, 2010

(54) DRAWING WAVEFORMS IN NO DEAD TIME ACQUISITION SYSTEM

(75) Inventors: Kenneth P. Dobyns, Beaverton, OR (US); Steven K. Sullivan, Beaverton, OR (US); Roy I. Siegel, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 456 days.

(21) Appl. No.: 12/104,563

(22) Filed: Apr. 17, 2008

(65) Prior Publication Data

US 2009/0261814 A1  Oct. 22, 2009

(51) Int. Cl.
*G01R 13/20* (2006.01)

(52) U.S. Cl. .................................. 324/121 R

(58) Field of Classification Search .................. 324/76, 324/15, 24, 38, 42, 76.12, 103 R, 115, 121 R, 324/158.1, 765; 345/134; 702/69, 67, 108
See application file for complete search history.

(56) References Cited

U.S. PATENT DOCUMENTS 6,225,972 B1 * 5/2001 Taraki et al. ............. 345/440.1
7,652,465 B2 * 1/2010 Sullivan et al. ......... 324/121 R

* cited by examiner

*Primary Examiner*—Ha Tran T Nguyen
*Assistant Examiner*—Tung X Nguyen
(74) *Attorney, Agent, or Firm*—Francis I. Gray; Thomas F. Lenihan

(57) ABSTRACT

A method of drawing a waveform image in a no dead time acquisition system, where consecutive drawing frames overlap, uses a master/slave relationship between two fast rasterizers. The master rasterizer draws a first display frame in response to a first trigger event in a trigger signal derived from an input signal. The slave rasterizer draws a second display frame in response to a subsequent trigger event in the trigger signal. The portion of the second display frame that duplicates data contained in the first display frame is either (a) suppressed when the first and second display frames are combined to form the waveform image or (b) displayed in a different shade/color. Alternatively the first display frame may be compressed by 50% to form a first portion of the waveform image and the non-duplicative portion of the second display frame is compressed by 50% to form a second portion of the waveform image, the first and second portions being drawn contiguously when the first and second display frames are combined to form the waveform image.

18 Claims, 3 Drawing Sheets

DRAWING WAVEFORMS IN NO DEAD TIME ACQUISITION SYSTEM

FIELD OF THE INVENTION

The present invention relates to a no dead time acquisition system for a test and measurement instrument, and more particularly to the drawing of waveforms when subsequent display frames overlap.

BACKGROUND OF THE INVENTION

The "dead time" of a measurement instrument, such as an oscilloscope, is a time when data acquisition circuitry does not respond to a valid trigger event by displaying a waveform representing an electrical signal being monitored. In an analog oscilloscope, for example, dead time occurs during beam retrace time on a cathode ray tube. In a digital oscilloscope dead time often occurs when the instrument is busy with a number of tasks, i.e., not able to process a trigger event when a previously acquired waveform is being read from an acquisition memory or when the instrument is busy drawing the acquired data to make an image of the waveform for display.

Electronic circuits occasionally work in an unexpected manner. The incorrect operation may be rare, perhaps occurring once in thousands of correct cycles of operation. Fast circuits that cycle quickly often operate at rates much faster than a standard digital oscilloscope can display the corresponding waveforms. The typical digital oscilloscope ignores most of the trigger events because it is busy processing and drawing waveforms between acquisitions. The waveforms that show the incorrect operation of the circuit may be missed, i.e., may occur during the dead time between acquisitions. An oscilloscope user may have to wait a long time in order to view the incorrect operation. Even though incorrect circuit operation may not be visible, the oscilloscope user may not ever have confidence that the circuit is working properly since only a small fraction of the waveform data representing the input signal are drawn on the oscilloscope display. The basic digital oscilloscope has an architecture in which data is received in an acquisition memory, and then acquisition is halted by a trigger event while the acquisition memory is read and the waveform drawing is performed.

Co-pending U.S. patent application Ser. No. 11/388,428, filed by Steven Sullivan et al on Mar. 24, 2006 entitled "No Dead Time Data Acquisition", is one attempt to enable the acquisition of all trigger events. A measurement instrument receives a digitized signal representing an electrical signal being monitored and generates from the digitized signal a trigger signal using a fast digital trigger circuit, the trigger signal including all trigger events within the digitized signal. The digitized signal is compressed as desired and delayed by a first-in, first-out (FIFO) buffer for a period of time to assure a predetermined amount of data prior to a first trigger event in the trigger signal. The delayed digitized signal is delivered to fast rasterizers or drawing engines upon the occurrence of the first trigger event to generate a waveform image. The waveform image is then provided to a display buffer for combination with prior waveform images and/or other graphic inputs from other drawing engines. The contents of the display buffer are provided to a display at a display update rate to show a composite of all waveform images representing the electrical signal. Two or more drawing engines may be used for each input channel of the measurement instrument to produce two or more waveform images, each waveform image having one of the trigger events of the trigger signal at a specified trigger position within a display window. The waveform images are combined to form a composite waveform image containing all the trigger events for combination with the previous waveform images in the display buffer and/or with graphics from other drawing engines. For certain trigger positions within the display window, an indicator is provided to show that a trigger event may have been missed. Also when there are no trigger events, a graphic of the signal content may still be provided for the display.

In the above-mentioned '428 U.S. patent application it is assumed that every display frame is drawn so as to include all trigger events over a sequence of display frames. As discussed in co-pending U.S. patent application Ser. No. 12/056,159, filed Mar. 26, 2008 by Kenneth P. Dobyns, et al entitled "Improved Holdoff Algorithm For No Dead Time Acquisition" [Attorney Docket Number 8257-US], to assure that all data related to the trigger events is displayed, an improved hold-off algorithm is disclosed. Unfortunately in order to assure that all relevant data is displayed, the display frames are drawn in an overlapping fashion, with duplicated data being drawn on the display screen multiple times. This approach to drawing waveforms may result in a confusing display for the instrument user.

Referring now to FIG. 1, a single glitch in the input signal is drawn in two places on the display screen with respect to a trigger point. In response to a first trigger event a first waveform is captured and drawn in a first display frame A. The second trigger event that has the glitch, since it occurs within the first display frame, does not form the basis for a new display frame and is therefore ignored. In response to a third trigger event which occurs outside the first display frame A, a waveform is captured and drawn in a second display frame B which coincidentally also includes the second trigger event. When the first and second display frames are combined for display, the glitch appears drawn in two places as shown. Although this is correct in that the glitch does occur in both places with respect to trigger events one and three, and by drawing a display frame for each trigger event the glitch may be drawn on all three pulses to be the most accurate, this is not the behavior expected by the user and may cause confusion.

Another similar example is shown in FIG. 2 where a burst of three pulses is drawn so it appears that there are five pulses on the instrument display screen. This is correct, assuming edge triggering, but it is still confusing for the user.

SUMMARY OF THE INVENTION

Accordingly, the present invention provides a method of a drawing waveform image in a no dead time acquisition system that clearly delineates the duplicated material that appears on the instrument display screen when consecutively drawn display frames overlap. A pair of fast rasterizers are configured in a master/slave relationship. The master rasterizer draws a first display frame for an input signal in response to a first trigger event in a trigger signal, the trigger signal being derived from the input signal. The slave rasterizer draws a second display frame for the input signal in response to a subsequent trigger event in the trigger signal. When the first and second display frames are combined for display on the instrument display screen, the duplicated data are clearly delineated. The duplicative data of the second display frame may be either (a) suppressed or (b) drawn in a different shade/color when the two display frames are combined by superposition. Alternatively the first display frame may be compressed by 50% to form a first portion of the waveform image and the non-duplicative data of the second display frame may be compressed by 50% to form a second portion of the waveform image. When combined, the first and second portions are displayed contiguously to form the waveform image on the instrument display screen.

The objects, advantages and other novel features of the present invention are apparent from the following detailed description when read in conjunction with the appended claims and drawing.

DETAILED DESCRIPTION OF THE DRAWING

Figure 3:
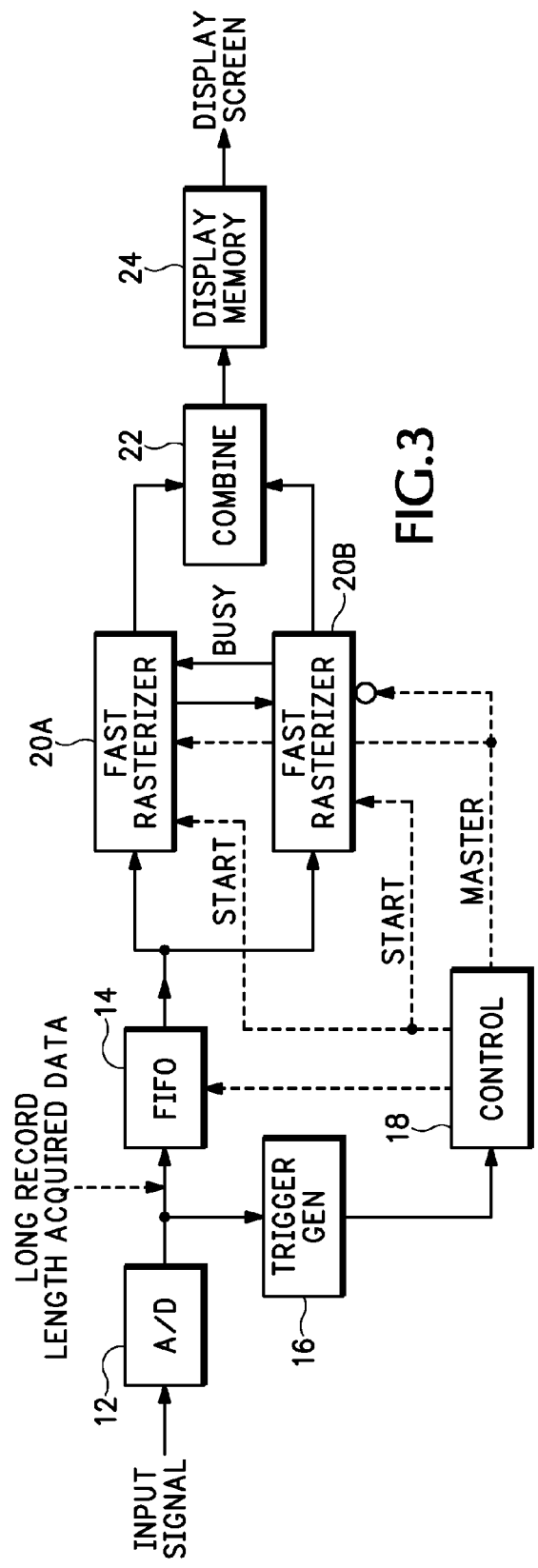
FIG. 3 is a block diagram view of an apparatus for drawing overlapping display frames on an instrument display that clearly indicates the duplicated data according to the present invention.

Referring now to FIG. 3, an input signal is digitized by an analog-to-digital converter (A/D) 12. The digitized data from the A/D 12, or already acquired digitized data from a long record length acquisition memory, is input to both a first-in/first-out (FIFO) buffer 14 and a trigger generator 16. The trigger generator 16 produces from the digitized data a trigger signal that includes each trigger event that is identified in the input signal. The trigger signal is input to a controller 18. The controller 18 in response to the trigger signal initiates drawing of waveform images by a pair of fast rasterizers 20A, 20B using the digitized data from the FIFO buffer 14. The image outputs from the fast rasterizers 20A, 20B are input to a combiner 22 that in turn provides a combined image to a display memory 24. The combined image from the display memory 24 is a waveform image that appears on an instrument display screen.

When a first trigger event occurs in the trigger signal, the controller 18 sends a start signal to one of the fast rasterizers 20 to draw a waveform image display frame using the digitized data from the FIFO buffer 14. The initial fast rasterizer 20 is designated as a master rasterizer by the controller 18. When a subsequent trigger event in the trigger signal is determined by the controller 18 to require the drawing of a next waveform image display frame, the controller starts the other fast rasterizer 20. A busy signal from the master rasterizer 20A to the second rasterizer 20B causes the second rasterizer to draw the next waveform image display frame in an alternative visual treatment so long as the master rasterizer is busy. The alternative visual treatment may either be essentially zero entries for the second display frame or entries using a different grey scale or color from that used by the master rasterizer 20A. When the master rasterizer 20A finishes drawing the first display frame, the second rasterizer 20A becomes the master rasterizer as it finishes drawing the second display frame. When a subsequent trigger event occurs that requires drawing a display frame, the controller 18 starts the master rasterizer 20 and the process is repeated for overlapping display frames.

Figure 1:
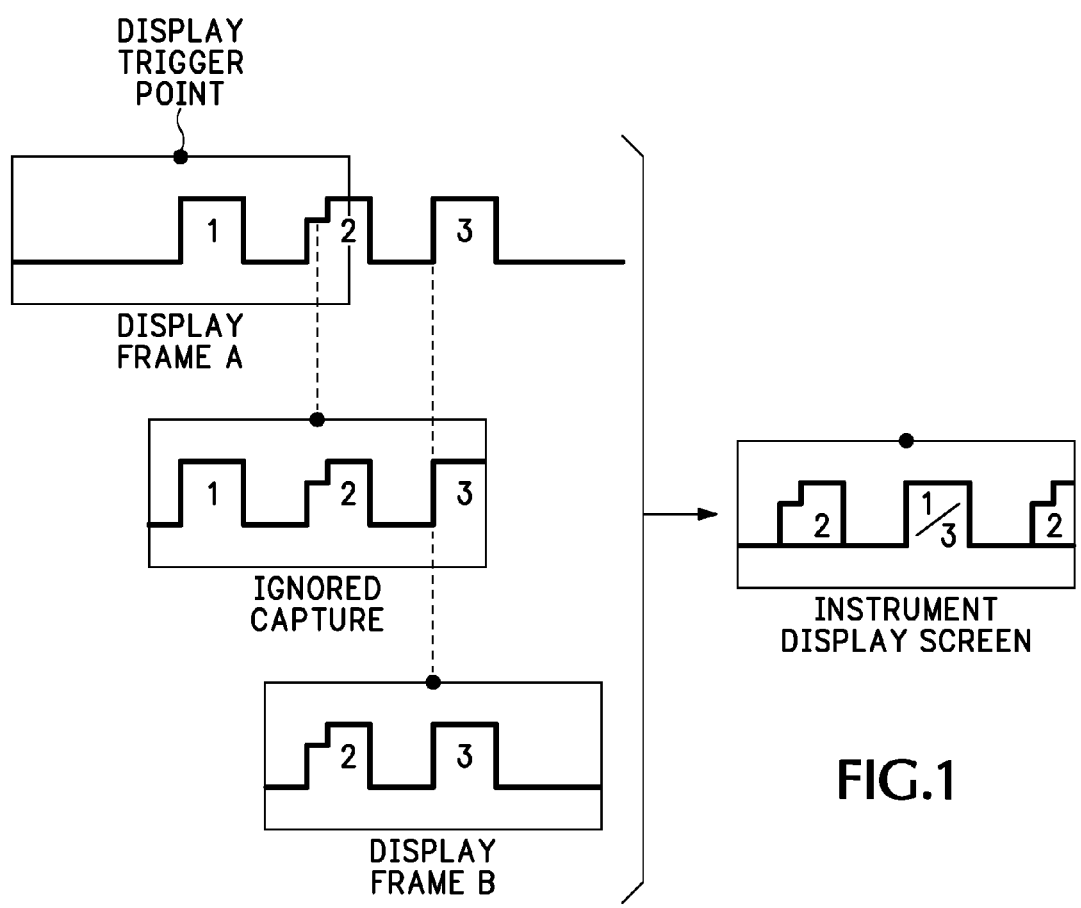
FIGS. 1 and 2 are illustrative views of overlapping display frames that, when combined for display on an instrument screen, present duplicated data.
Figure 2:
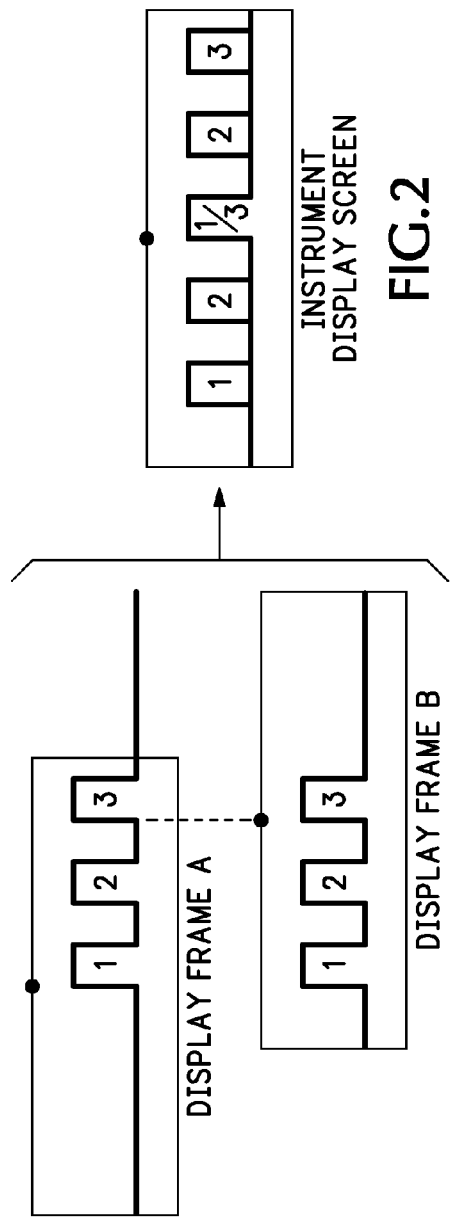
Figure 4:
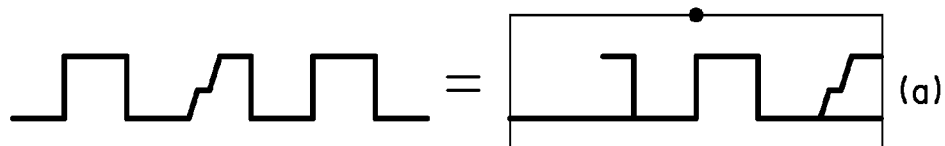
FIGS. 4 and 5 are illustrative views corresponding to FIGS. 1 and 2 respectively that differentiate duplicated data from original data when overlapping display frames are combined according to the present invention.
Figure 4:
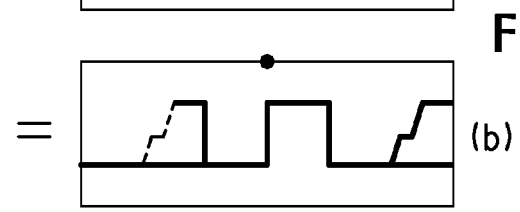
Figure 5:
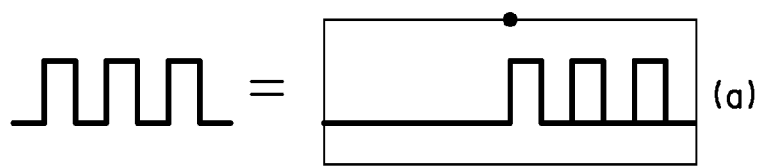
Figure 5:
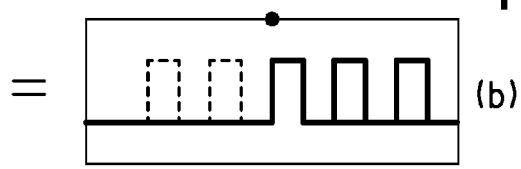

Referring now to FIGS. 4 and 5, corresponding to FIGS. 1 and 2, either the duplicated data is (a) inhibited or blanked (zero entries) or (b) displayed in a different shade or color (dotted lines). In this way, it is clear to the user observing the display screen what the actual waveform image is, i.e., exactly where the waveform glitch is with respect to the first trigger event (FIG. 4) or exactly how many pulses are in the pulse train (FIG. 5).

Figure 6:
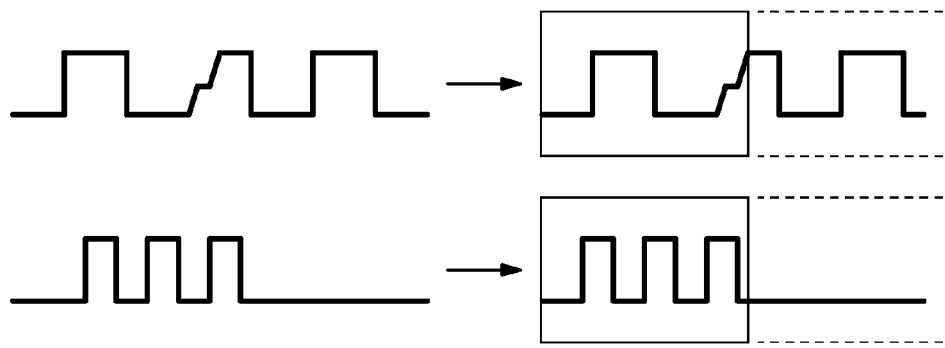
FIG. 6 is an illustrative view for drawing overlapping display frames as a single waveform image when combined for display according to the present invention.

Another alternative is to recognize that waveform images only overlap neighboring waveform images, so the controller 18 only draws every other waveform image as a display frame that is compressed into one-half of the display space. The non-duplicated portion of the waveform image that exists between the two display frames is identified, compressed and inserted in the remaining portion of the display space so it does not overlap the previously drawn information. This requires a larger FIFO buffer 14, and the master rasterizer 20A outputs its image to the display memory 24 in compressed form and the slave rasterizer 20B does not provide an output until the master rasterizer is no longer busy. Then the slave rasterizer 20B provides the remaining portion of its display frame in compressed form to the display memory 24 so it appears to be a continuation of the waveform image from the master rasterizer 20A, as shown in FIG. 6.

Thus, the present invention provides a method of drawing waveform images in a no dead time acquisition system that provides a display screen when overlapping display frames occur that avoids user confusion caused by duplicated data.

What is claimed is:

1. A method of drawing a waveform image representing an input signal in a no dead time acquisition system comprising the steps of:

generating a trigger signal from the input signal that includes all trigger events contained in the input signal;

drawing a first display frame representing a portion of the input signal in response to a first trigger event in the trigger signal;

drawing a second display frame representing another contiguous portion of the input signal in response to a subsequent trigger event in the trigger signal; and combining the first and second display frames to form the waveform image such that duplicated data between the first and second display frames caused by overlap between the first and second display frames is readily apparent.

2. The method as recited in claim 1 wherein the combining step comprises the steps of:

drawing the waveform image from the first display frame using a first characteristic;

drawing the waveform image from the second display frame using a second characteristic while the waveform image from the first display frame is still being drawn; and drawing the waveform image from the second display frame using the first characteristic when the waveform image from the first display frame is completed.

3. The method as recited in claim 2 wherein the first and second characteristics comprise different grey scale shades.

4. The method as recited in claim 2 wherein the first and second characteristics comprise different colors.

5. The method as recited in claim 1 wherein the combining step comprises the steps of:

drawing the first display frame in a compressed form to produce a first portion of the waveform image; and drawing the portion of the second display frame that occurs after completion of the first frame in a compressed form to produce a second portion of the waveform image contiguous to the first portion.

6. The method as recited in claim 1 wherein the input signal comprises a signal selected from the group consisting of a realtime input signal and an acquired input signal.

7. A display apparatus comprising:

means for generating a trigger signal from an input signal, the trigger signal including all trigger events within the input signal;

means for drawing a first display frame representing a portion of the input signal in response to a first trigger event within the trigger signal;

means for drawing a second display frame representing a contiguous portion of the input signal in response to a subsequent trigger event within the trigger signal; and means for combining the first and second display frames to form a waveform image such that duplicated data between the first and second display frames caused by overlap between the first and second display frames is readily apparent.

8. The display apparatus as recited in claim 7 wherein the combining means comprises:

means for drawing the waveform image from the first display frame using a first characteristic; and means for drawing the waveform image from the second display frame using a second characteristic while the waveform image from the first display frame is being drawn, and using the first characteristic when the waveform image from the first display frame is completed.

9. The display apparatus as recited in claim 8 wherein the first and second characteristics comprise different grey scale shades.

10. The display apparatus as recited in claim 8 wherein the first and second characteristics comprise different colors.

11. The display apparatus as recited in claim 7 wherein the combining means comprises:

means for drawing the first display frame in a compressed form to produce a first portion of the waveform image; and means for drawing a portion of the second display frame that occurs after completion of the first frame in a compressed form to produce a second portion of the waveform image contiguous to the first portion of the waveform image to form the waveform image.

12. The display apparatus as recited in claim 7 wherein the input signal comprises a signal selected from the group consisting of a realtime input signal and an acquired input signal.

13. A display apparatus comprising:

a trigger generator having as an input an input signal and having as an output a trigger signal that includes all trigger events within the input signal;

a first drawing engine having as an input a delayed version of the input signal and having as an output a first display frame representing a first portion of the input signal in response to a first trigger event within the trigger signal;

a second drawing engine having as an input a delayed version of the input signal and having as an output a second display frame representing a second portion of the input signal contiguous to the first portion in response to a subsequent trigger event within the trigger signal; and a combiner having as inputs the first and second display frames and having as an output a waveform image that is the combination of the first and second display frames, such that duplicated data between the first and second display frames caused by overlap between the first and second display frames is readily apparent.

14. The display apparatus as recited in claim 13 wherein the combiner comprises a controller coupled to the first and second drawing engines such that the first drawing engine draws the waveform image from the first display frame using a first characteristic, and the second drawing engine draws the waveform image from the second display frame using a second characteristic where the first and second display frames overlap and using the first characteristic when the first drawing engine completes the first display frame.

15. The display apparatus as recited in claim 14 wherein the first and second characteristics comprise different grey scale shades.

16. The display apparatus as recited in claim 14 wherein the first and second characteristics comprise different colors.

17. The display apparatus as recited in claim 13 wherein the combiner comprises a controller coupled to the first and second drawing engines such that the first display frame is drawn in a compressed form to produce a first portion of the waveform image and the portion of the second display frame that occurs after the first display frame is completed is drawn in the compressed form to produce a second, contiguous portion of the waveform image, the first and second portions forming the waveform image for display.

18. The display apparatus as recited in claim 13 wherein the input signal comprises a signal selected from the group consisting of a realtime input signal and an acquired input signal.

* * * * *